(12) United States Patent
Ho et al.

(10) Patent No.: US 7,033,917 B2
(45) Date of Patent: Apr. 25, 2006

(54) PACKAGING SUBSTRATE WITHOUT PLATING BAR AND A METHOD OF FORMING THE SAME

(75) Inventors: Kwun-Yao Ho, Hsien-Tien (TW); Moriss Kung, Hsien-Tien (JP)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/945,961

(22) Filed: Sep. 22, 2004

(65) Prior Publication Data

US 2005/0266608 A1 Dec. 1, 2005

(30) Foreign Application Priority Data

May 28, 2004 (TW) .................. 93115353 A

(51) Int. Cl.
*H01L 21/20* (2006.01)
*H05K 3/00* (2006.01)

(52) U.S. Cl. ........................ 438/584; 29/829

(58) Field of Classification Search ................ 438/584; 29/592.1, 825, 829, 846
See application file for complete search history.

(56) References Cited

U.S. PATENT DOCUMENTS 6,739,048 B1 * 5/2004 Jones et al. .................. 29/852

* cited by examiner

*Primary Examiner*—Scott Geyer
(74) *Attorney, Agent, or Firm*—Troxell Law Office, PLLC

(57) ABSTRACT

A packaging substrate without plating bar and a method of forming the same is provided. A substrate is firstly provided with circuit patterns formed thereon. Then, solder masks are formed to define connecting points on the circuit patterns. Afterward, the openings of the solder mask on a bottom surface of the substrate are filled with solder material. Thereafter, a seed layer is formed on the bottom surface of the solder mask and the solder material, and then a passivation layer is formed on a surface of the seed layer. Finally, a plating process is carried out by using the seed layer to input cathode electric level to form metal pads on the defined connecting points on the upper surface of the substrate.

12 Claims, 9 Drawing Sheets

PACKAGING SUBSTRATE WITHOUT PLATING BAR AND A METHOD OF FORMING THE SAME

BACKGROUND OF THE INVENTION (1) Field of the Invention

This invention relates to a packaging substrate and a method of forming the same, and more particularly to a packaging substrate without a plating bar.

(2) Description of Related Art

As semiconductor fabrication technology has been effectively improving, it is the trend to have a central processing unit (CPU) characterized with small-size, multi-function, and high-speed. Such a CPU needs an increased number of input/output (I/O) contacts to transmit data for various purposes, and is usually formed with arrayed I/O pads to increase I/O density (pitch$\leq$200 μm). To deal with the arrayed I/O pads, a flip-chip packaging method, in which a die is connected to a packaging substrate by using bumps, becomes more popular.

FIGS. 1A to 1D depict schematic cross-section views of a fabrication method of a packaging substrate for flip-chip packaging. Firstly, as shown in FIG. 1A, a substrate 100 is provided with through holes 110 formed by mechanical or laser drilling. Afterward, the through holes 110 are plated with conductive material, and then conductive layers 102 connecting to the plated through holes 110 are formed on opposing surfaces of the substrate 100. Then, as shown in FIG. 1B, a lithographic and etching process is carried out toward the conductive layers 102 to form a first conductive pattern 120 on an upper surface of the substrate 100 and a second conductive pattern 130 on a bottom surface of the substrate 100. Through the plated through holes 110, the first conductive pattern 120 can electrically connect with the second conductive pattern 130. It should be noted that a plating bar 140 electrically connecting to the first conductive pattern 120 and the second conductive pattern 130 must be simultaneously formed in the step shown in FIG. 1B.

Afterward, as shown in FIG. 1C, a first solder mask (SM) 122 and a second solder mask 132 are formed on the opposing surfaces of the substrate 100 for covering predetermined portions of the two conductive patterns 120 and 130 respectively to define particular connecting positions. Then, as shown in FIG. 1D, a plurality of metal pads 124 and 134 are formed in the openings of the solder masks 122 and 132 by plating. It is noted that the plating bar 140 is utilized for providing negative charges to both the conductive patterns 120 and 130. Thus, the conductive patterns 120 and 130 become cathodes in the plating process shown in FIG. 1D, which can let metal ions adhered thereon.

However, the existence of the plating bar 140 may sacrifice a significant amount of area size on the substrate 100 for laying the conductive patterns 120 and 130, and the number of connecting positions on the substrate 100 is thus limited.

On the other hand, an electroless plating technology, which no plating bar 140 is needed, can be used for forming a highly smooth plating surface. However, the electroless plating technology has a primary drawback that poor adhesion is resulted between the plating layer and the plated layer. The metal pads 124 and 134 formed in the process of FIG. 1D need a tightly adhesion toward the conductive patterns 120 and 130 so as to guarantee a reliable signal transmission path. Therefore, the electroless plating technology is not suitable in the present situation.

Moreover, in the plating process of FIG. 1D, the metal pads 124 and 134 are respectively formed simultaneously on the first conductive pattern 120 and the second conductive pattern 130 so that identical material composition and similar thickness can be achieved. However, metal pads 124 and 134 arranged with different pitches on the opposing surfaces of the substrate 100 are preferred in most packaging designs for adapting different connecting means, such as pins and bumps, on the opposing surfaces. For example, in a typical flip-chip packaging, the metal pads 124 on the upper surface of the substrate 100 are used to connect to a die with high density arrayed pads through the bumps, and the metal pads 134 on the bottom surface are used to connect to a main board by using pins, bumps, or other conducting means. The pitch of the metal pads 124 on the upper surface is thus smaller than that of the metal pads 134 on the bottom surface.

For the electroless plating technology is not suitable for plating metal pads 124 and 134 onto the conductive patterns 120 and 130, an additional plating bar 140 is thus required for providing negative charges to the conductive patterns 120 and 130. In addition, the plated metal pads with identical material composition and similar thickness may limit the adaptability of such packaging substrate.

SUMMARY OF THE INVENTION

Accordingly, the present invention provides a fabrication method having a plating step without using a plating bar so as to have the area on the packaging substrate less occupied, and also to increase the number of connecting positions on the packaging substrate.

The present invention also provides a fabrication method allowing different connecting means formed on the opposing surfaces of the packaging substrate, so that arrangement regarding the packaging can be versatile.

A fabrication method of a packaging substrate introduced in the present invention including: providing a substrate with a first conductive pattern formed on an upper surface thereof and a second conductive pattern electrically connecting to the first conductive pattern formed on a bottom surface thereof; then forming a first solder mask on the upper surface to define first connecting positions on the first conductive pattern and a second solder mask on the bottom surface to define second connecting positions on the second conductive pattern; forming a seed layer on the bottom surface and electrically connecting to the second conductive pattern; forming a passivation layer on a surface of the seed layer; and connecting a cathode to the seed layer for plating metal pads covering the exposed first conductive pattern.

A packaging substrate in accordance with the present invention comprises a substrate with a first conductive pattern formed on an upper surface thereof and a second conductive pattern electrically connecting to the first conductive pattern formed on a bottom surface thereof; a first solder mask, formed on the upper surface to cover part of a first conductive pattern and thus define first connecting positions on the first conductive pattern for connecting to a die; a second solder mask, formed on the bottom surface to cover part of a second conductive pattern and define second connecting positions on the second conductive pattern for connecting to a main board; and a plurality of metal pads formed in the openings of the first solder mask to connecting to the first conductive pattern by plating without using a plating bar.

Reference will now be made in detail to the preferred embodiments of the present invention, examples of which are illustrated in the accompanying drawings. Wherever possible, the same reference numbers will be used throughout the drawings to refer to the same or like parts.

BRIEF DESCRIPTION OF THE DRAWINGS

The present invention will now be specified with reference to its preferred embodiment illustrated in the drawings, in which.

DETAIL DESCRIPTION OF THE PREFERRED EMBODIMENTS

Figure 2A:
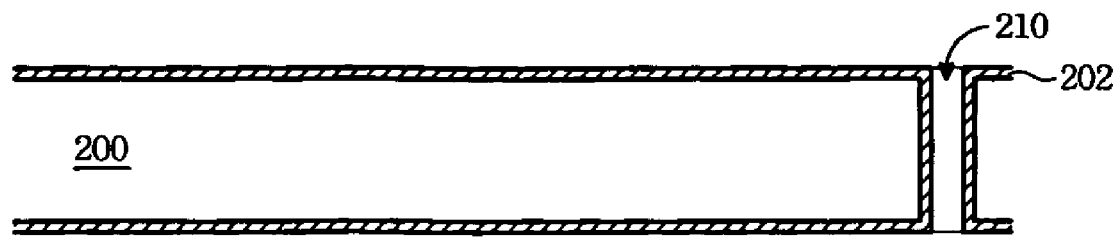
FIGS. 2A to 2I depict a sequence of schematic views to show a first preferred embodiment of a fabrication method of a packaging substrate in accordance with the present invention.

FIGS. 2A to 2I depict a sequence of schematic views to show a first preferred embodiment of a fabrication method of a packaging substrate in accordance with the present invention. Firstly, as shown in FIG. 2A, a substrate 200 is provided with through holes 210 formed by mechanical or laser drilling. Afterward, the substrate 200 and the through holes 210 are plated with a conductive material to form conductive layers 202 on the opposing surfaces of the substrate 200. Also as shown, the conductive layers 202 are connected electrically with the plated through holes (or blind via, not shown in figures) 210.

Figure 2B:
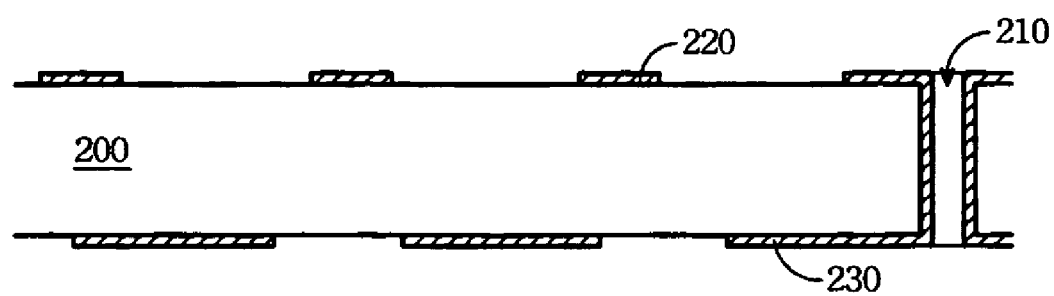

Then, as shown in FIG. 2B, a lithographic and etching process is carried out toward the conductive layers 202 to result a first conductive pattern 220 on an upper surface of the substrate 200 and a second conductive pattern 230 on a bottom surface of the substrate 200. The first conductive pattern 220 is communicated electrically with the second conductive pattern 230 through the plated through holes (or blind via, not shown in figures) 210, and thus a basic circuit board is therefore resulted.

Figure 2C:
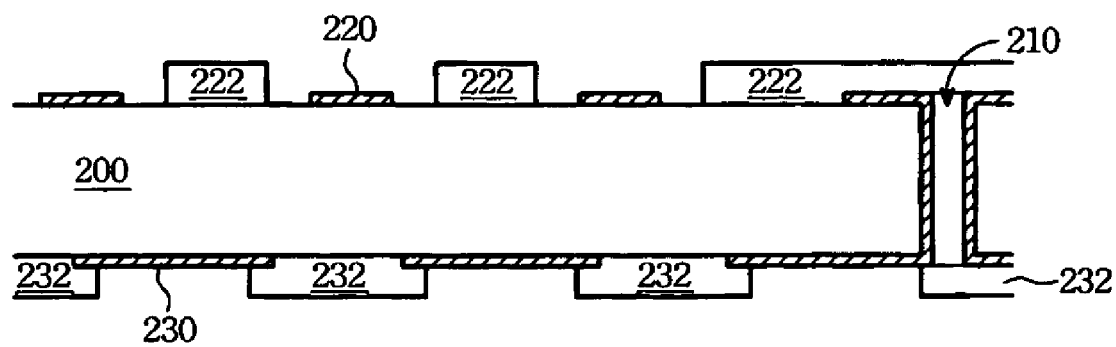

Afterward, as shown in FIG. 2C, a first solder mask (SM) 222 is formed on the upper surface of the substrate 200 to define a predetermined number of first connecting positions on the first conductive pattern 220, and a second solder mask 232 is formed on the bottom surface of the substrate 200 to define another predetermined number of second connecting positions on the second conductive pattern 230.

Figure 2D:
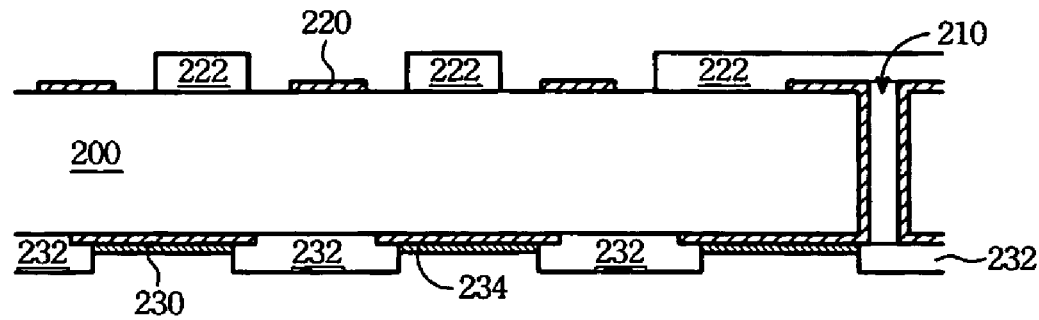
Figure 2E:
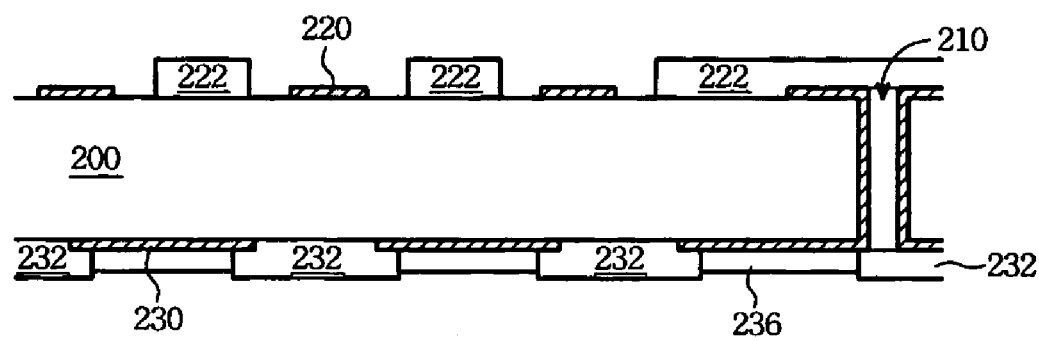
Figure 2F:
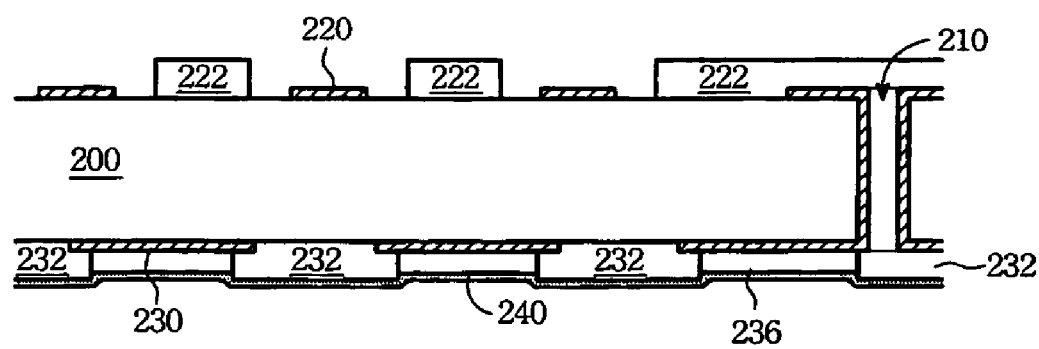
Figure 2G:
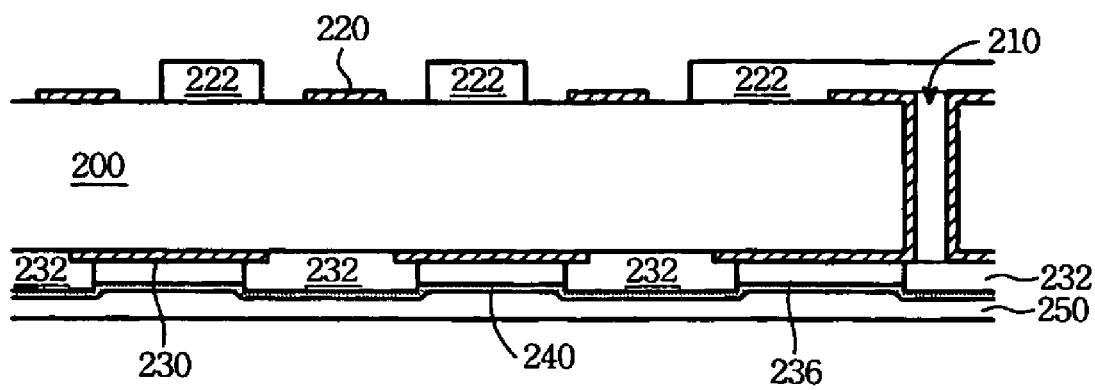

Then, as shown in FIG. 2D, an organic surface preservative (OSP) layer 234 is formed in the openings of the second solder mask 232 to cover the exposed surfaces of the second conductive pattern 230. The OSP layer 234 is specifically utilized to prevent the composition, such as copper, of the conductive pattern 230 from being thermally oxidized. Afterward, as shown in FIG. 2E, solder layers 236 are filled into the openings of the second solder mask 232, and the OSP layer 234 (FIG. 2D) is vaporized simultaneously by the heat. It is noted that the existence of the OSP layer 234 helps to prevent the formation of surface oxides between the solder layer 236 and the conductive pattern 230 so as to guarantee a reliable adhesion between the solder layers 236 and the conductive pattern 230.

Figure 1A:
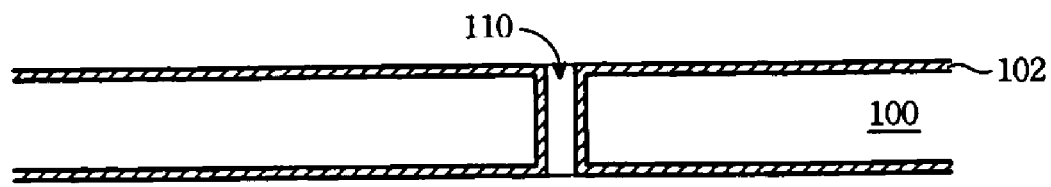
FIGS. 1A to 1D depict schematic cross-section views of a fabrication method of a packaging substrate for flip-chip packaging.

Then, an electroless deposition process such as physical vapor deposition process, is carried out without any preceding lithographic steps to form a seed layer 240 on the exposed surfaces of the second solder mask 232 and the solder layers 236. The deposited seed layer 240, which is usually composed of copper, has a preferred thickness less than 1 micron. Afterward, as shown in FIG. 1G, a passivation layer 250 is formed on the surface of the seed layer 240.

It is noted that the seed layer 240 builds a current transmission path from an edge of the substrate 200 toward the solder layers 236. The solder layers 236 are electrically connected to the second conductive pattern 230, and the second conductive pattern 230 is further electrically connected to the first conductive pattern 220 through the plated through holes (or blind via, not shown in figures) 210. Therefore, in the plating process shown in FIG. 2H, by connecting a cathode to the seed layer 240, the exposed surfaces of the first conductive pattern 220 may segregate negative charges to attract positive metal ions adhering thereon to form metal pads 224 covering the exposed first conductive pattern 220. Finally, as shown in FIG. 2I, the unwanted passivation layer 250 and the seed layer 240 are removed to expose the solder layers 236 on the bottom surface of the substrate 200 to finish the packaging substrate.

Figure 2H:
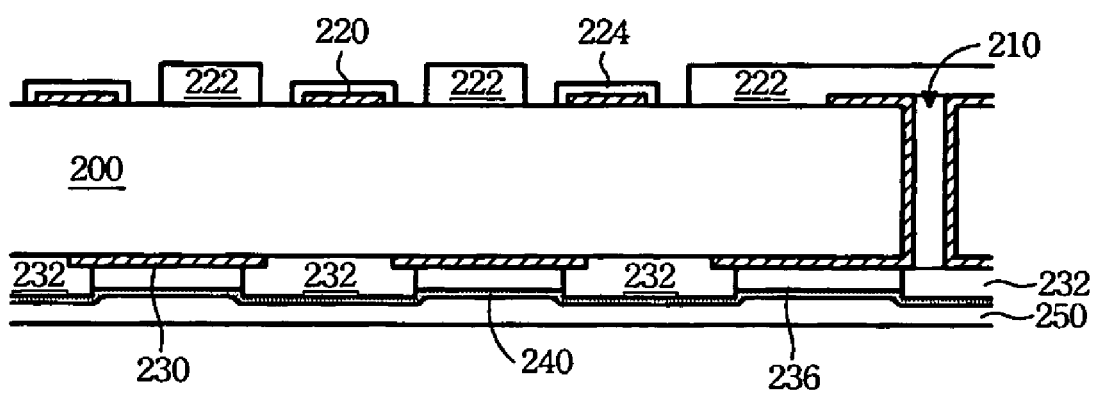
Figure 2I:
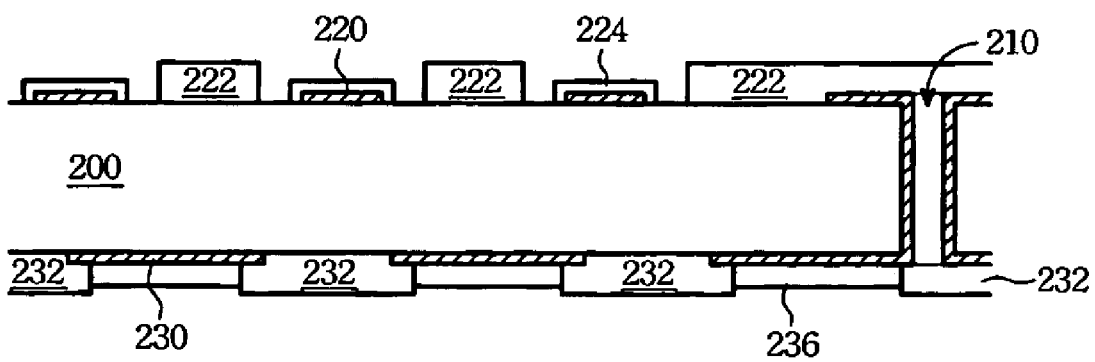

As shown in FIG. 2I, the packaging substrate formed by the above mentioned fabrication process has the substrate 200, the first conductive pattern 220, the second conductive pattern 230, the first solder mask 222, the second solder mask 232, a plurality of solder layers 236, and a plurality of metal pads 224. The first conductive pattern 220 is formed on the upper surface of the substrate 200, and the second conductive pattern 230 electrically connecting to the first conductive pattern 220 is formed on the bottom surface of the substrate 200.

The first solder mask 222 is formed on the first conductive pattern 220 and the upper surface of the substrate 200, and covers part of the first conductive pattern 220 to define the first connecting positions on the first conductive pattern 220 for connecting to a die. The second solder mask 232 is formed on the bottom surface of the second conductive pattern 230 and the substrate 200, and covers part of the second conductive pattern 230 to define the second connecting positions on the second conductive pattern 230 for connecting to a main board. The solder layers 236 fill the openings of the second solder mask 232 and connect to the second conductive pattern 230. The metal pads 224 are formed in the openings of the first solder mask 222 to connect to the exposed first conductive pattern 220 by plating without using plating bar.

It is noted that the resulted packaging substrate has some metal pads 224 on the upper surface thereof and some solder layers 236 on the bottom surface thereof. The material composition and the thickness of the metal pads 224, the OSP layer 234, and the solder layers 236 may be adjusted individually. For example, the metal pads 224 in the present embodiment, which is formed right above the conductive pattern 220, may be specifically chosen as a gold/nickel plated layer to prevent the formation of some unwanted inter-metallic compositions. Moreover, the metal pads 224 formed on the upper surface of the substrate 200 are utilized for connecting the die pads, which usually needs a higher arrayed density. Therefore, the pitch of the metal pads 224 on the upper surface of the substrate 200 is much smaller than that of the solder layers 236 on the bottom surface thereof.

Figure 3A:
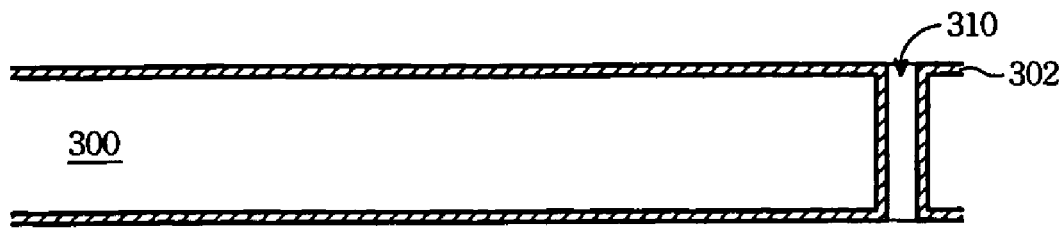
FIGS. 3A to 3I depict a sequence of schematic views to show a second preferred embodiment of a fabrication method of a packaging substrate in accordance with the present invention.
Figure 3B:
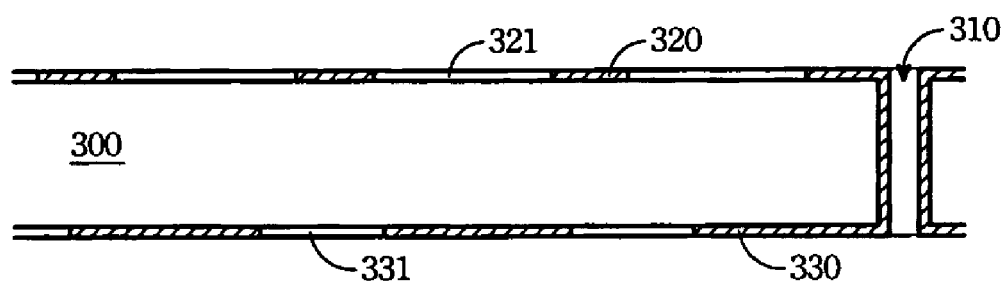

FIGS. 3A to 3I depict a sequence of schematic views to show a second preferred embodiment of a fabrication method of a packaging substrate in accordance with the present invention. Firstly, as shown in FIG. 3A, a substrate 300 is provided with plated through holes 310 formed therein, and two conductive layers 302 connecting to the plated through holes 310 are formed on the opposing surfaces of the substrate 300. Then, as shown in FIG. 3B, a lithographic and etching process is carried out toward the conductive layers 302 to result a first conductive pattern 320 on an upper surface of the substrate 300 and a second conductive pattern 330 on a bottom surface of the substrate 300.

Figure 3C:
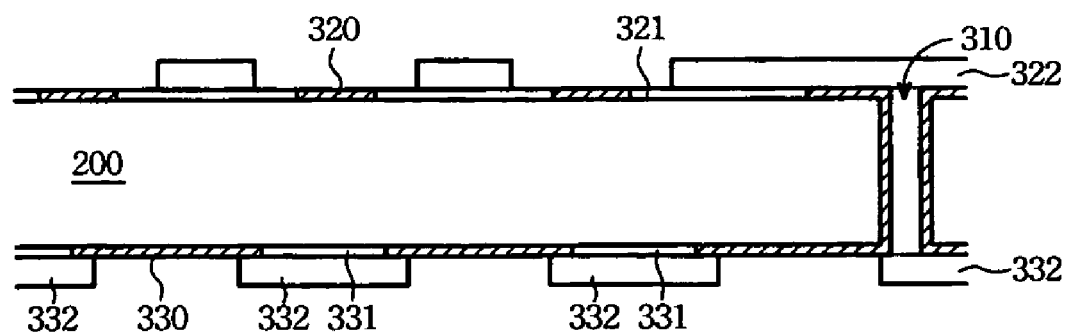

Afterward, as shown in FIG. 3C, isolation layers 321 and 331 are under coated into the openings of the conductive pattern 320 and 330 to prevent ion migration event resulting short circuit or open circuit. Then, a first solder mask 322 is formed on the upper surface of the substrate 300 for covering part of the conductive pattern 320 and the isolation layer 321 so as to define first connecting positions on the first conductive pattern 320, and also a second solder mask 332 is formed on the bottom surface of the substrate 300 for covering part of the conductive pattern 330 and the isolation layer 331 so as to define second connecting positions on the second conductive pattern 330.

Figure 3D:
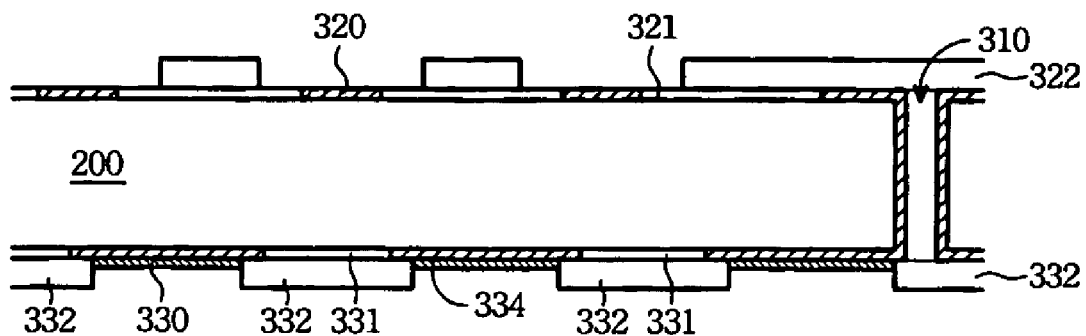
Figure 3E:
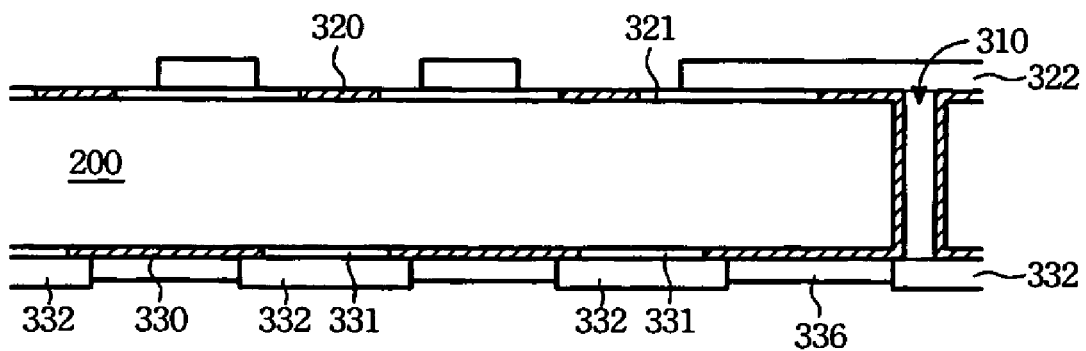
Figure 3F:
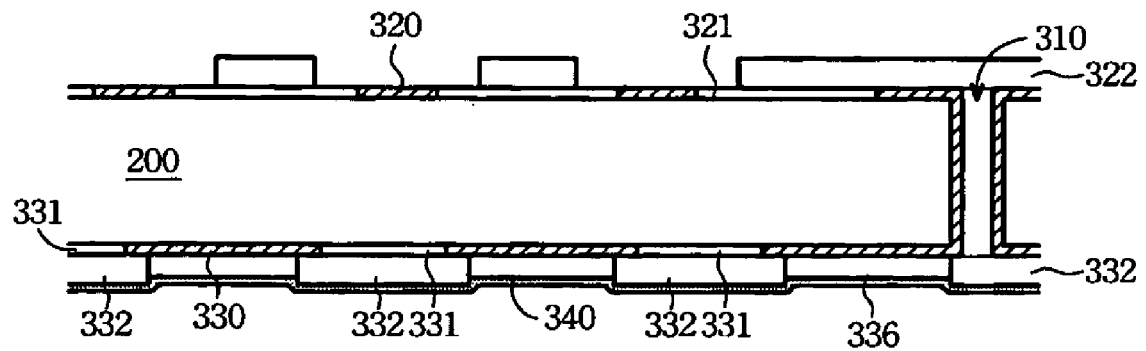
Figure 3G:
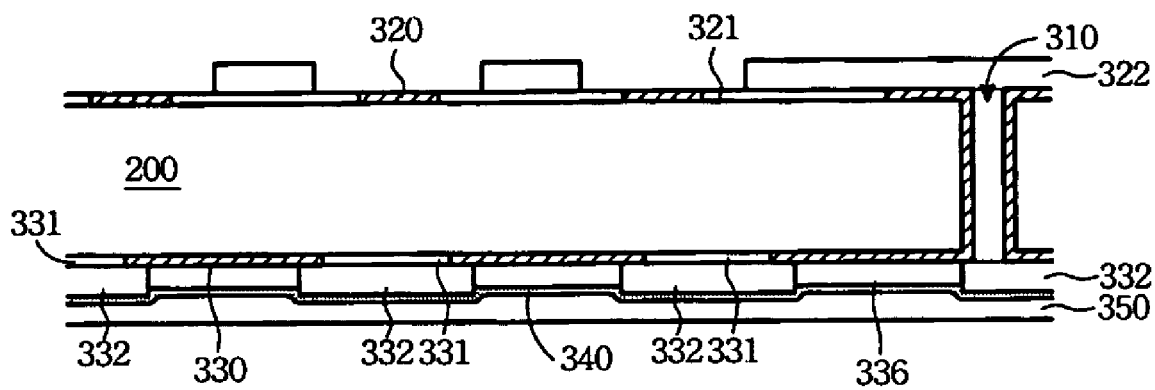
Figure 3H:
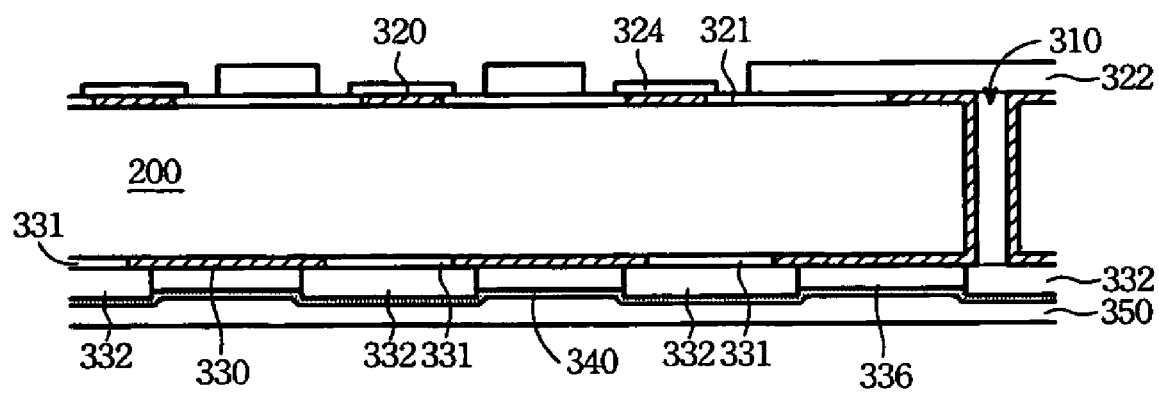

Then, as shown in FIG. 3D, an OSP layer 334 is formed in the openings of the second solder mask 332 to prevent the oxidation of the second conductive pattern 330. Afterward, as shown in FIG. 3E, solder layers 336 are filled into the openings of the second solder mask 332, and the OSP layer 334 is vaporized simultaneously by the heat. Afterward, as shown in FIG. 3F, a seed layer 340 is formed on the exposed surfaces of the second solder mask 332 and the solder layers 336. Then, as shown in FIG. 3G, a passivation film 350 is formed on a bottom surface of the seed layer 340.

Figure 3I:
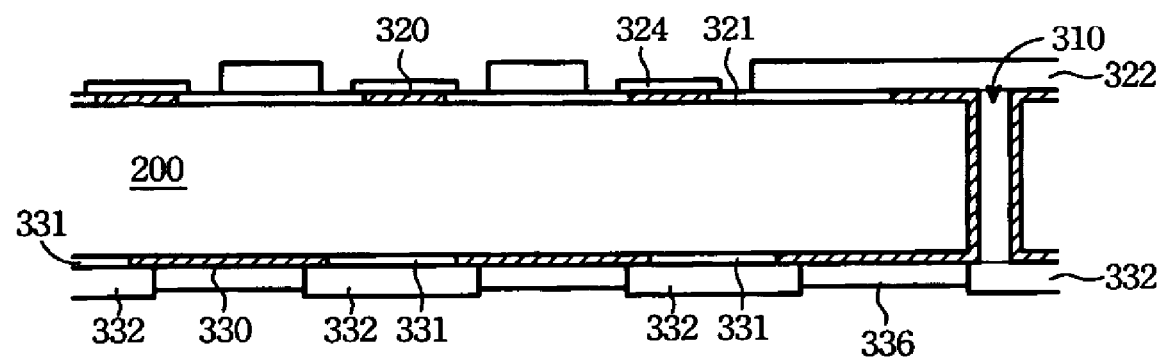

The seed layer 340 builds a current transmission path from an edge of the substrate 300 toward the solder layers 336. Therefore, in the plating process shown in FIG. 3H, by connecting a cathode to the seed layer 340, the exposed surfaces of the first conductive pattern 320 may segregate negative charges to attract positive metal ions adhered thereon to form metal pads 324 covering the exposed first conductive pattern 320. Finally, as shown in FIG. 3I, the unwanted passivation layer 350 and the seed layer 340 are removed to expose the solder layers 336 on the bottom surface of the substrate 300 to finish the packaging substrate.

Figure 4A:
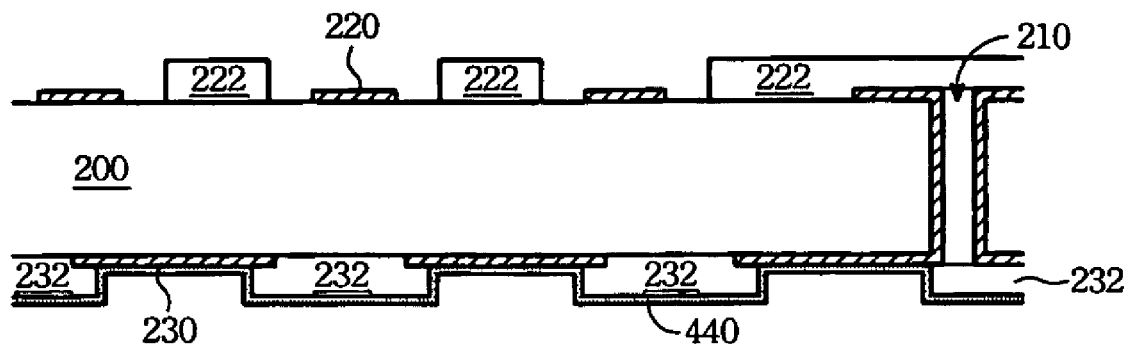
FIGS. 4A to 4E depict a sequence of schematic views to show a third preferred embodiment of a fabrication method of a packaging substrate in accordance with the present invention following the step shown in FIG. 2C.
Figure 4B:
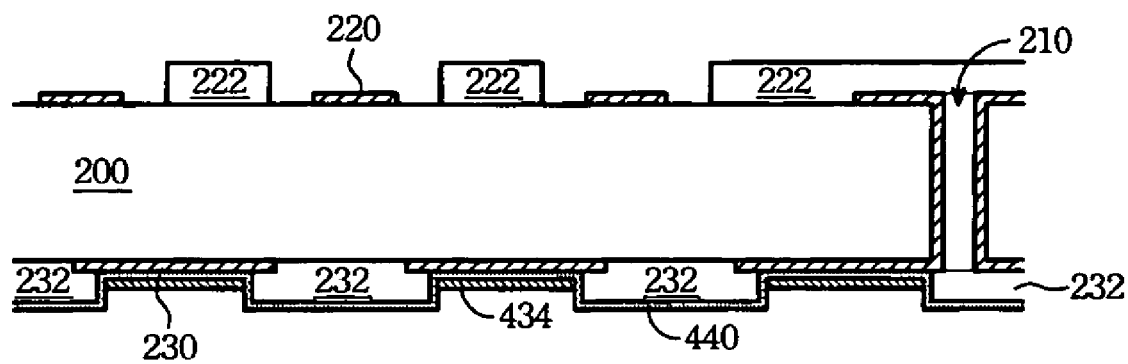
Figure 4C:
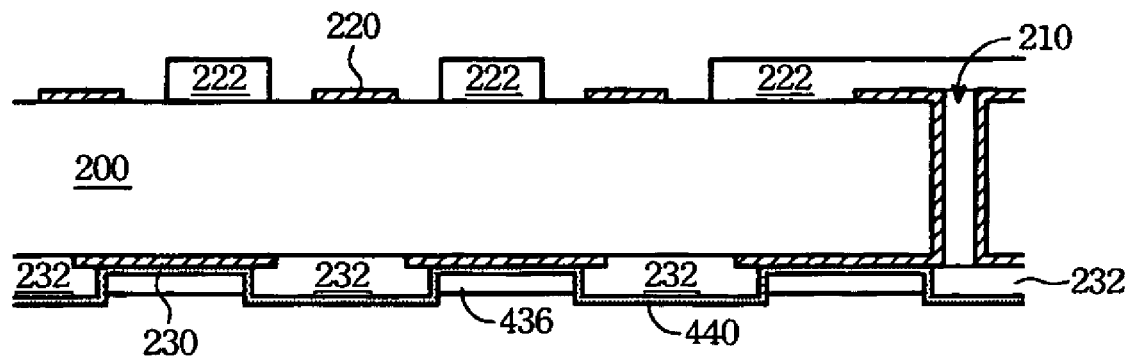

FIGS. 4A to 4D depict a sequence of schematic views to show a third preferred embodiment of a fabrication method of a packaging substrate in accordance with the present invention following the step shown in FIG. 2C. As shown in FIG. 4A, a seed layer 440 is formed on a bottom surface of the second solder mask 232 and the second conductive pattern 230. Then, as shown in FIG. 4B, an OSP layer 434 is formed on a bottom surface of the seed layer 440 with respect to the openings of the second solder mask 232. Afterward, as shown in FIG. 4C, solder layers 436 are formed on the OSP layer 434, and the OSP layer 434 is vaporized simultaneously by the heat.

Figure 4D:
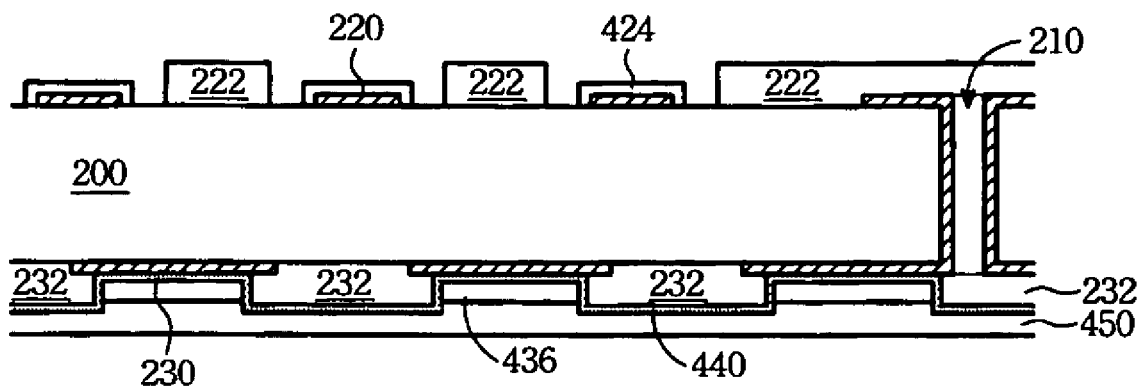
Figure 4E:
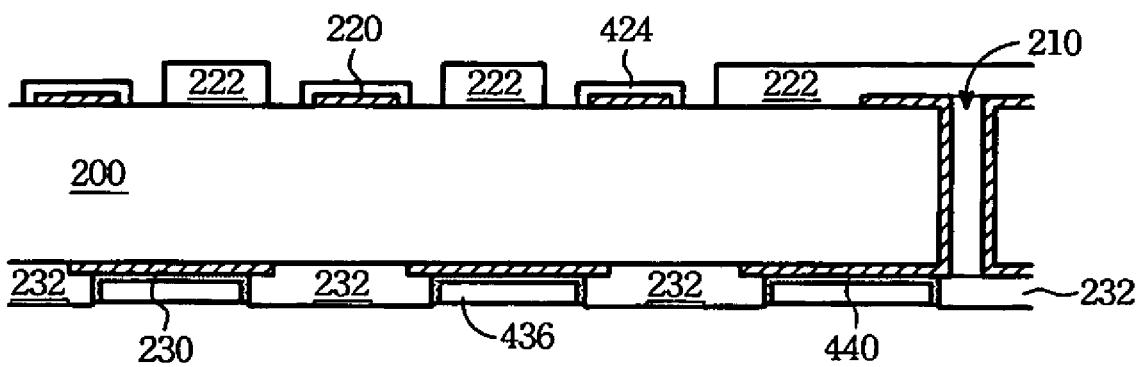

Afterward, as shown in FIG. 4D, a passivation layer 450 is formed on a bottom surface of the solder layers 436 and the seed layer 440. A cathode voltage level is applied through the seed layer 440, the second conductive pattern 230, and the plated through hole 210 to the first conductive pattern 220 for plating metal pads 424 on the first conductive pattern 220 through the openings of the first solder mask 222. Finally, as shown in FIG. 4E, the unwanted passivation layer 450 and the seed layer 440 are removed to expose the solder layers 436 to finish the packaging substrate.

Notice that the OSP layer and the solder layers in the foregoing described embodiments could be omitted in the present invention. (Not shown in figure). Taking the third embodiment as an example. If there has no OSP layer 434 and solder layers 436 on the bottom surface, the passivation layer is formed directly over seed layer 440. Accordingly, removing passivation layer 450 and seed layer 440 would result exposed Cu pad. In this case, the OSP layer will be applied on the exposed Cu pad as surface finish.

A substrate without solder layer 436 would have better reliability when using lead-free solder balls in the following mounting process.

Figure 1B:
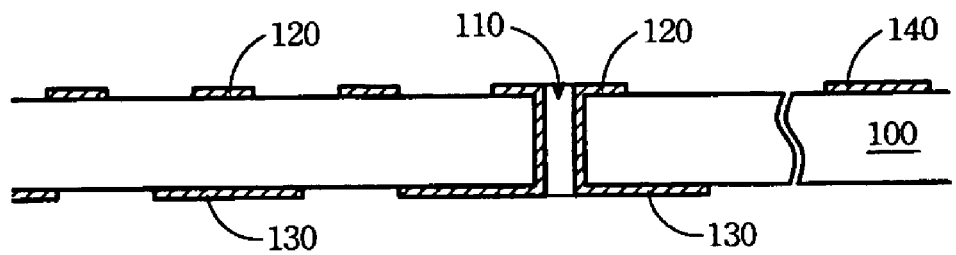
Figure 1C:
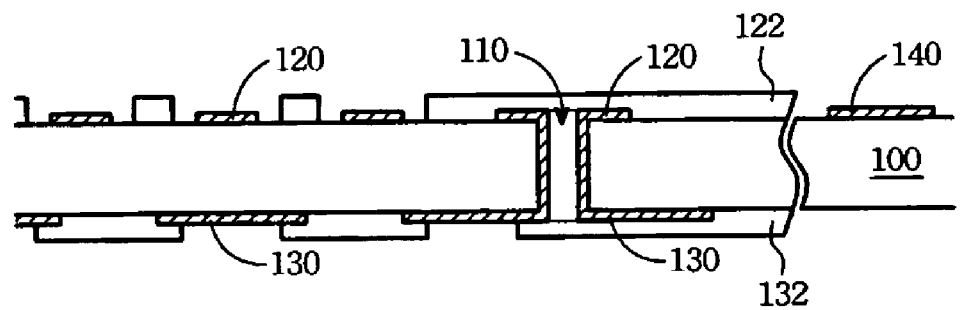
Figure 1D:
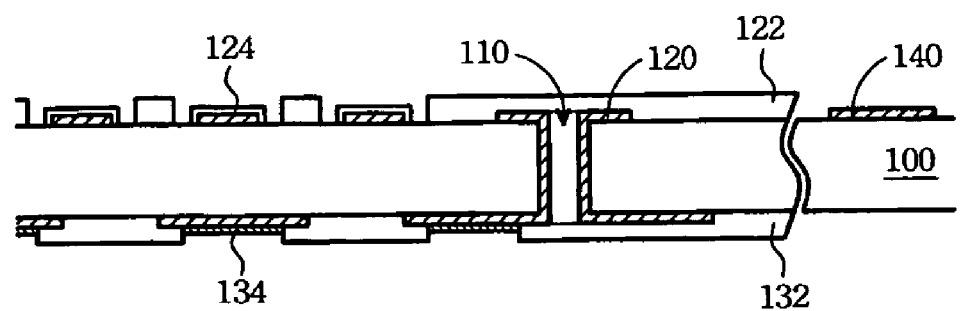

By contrast to the prior art packaging substrate, the packaging substrate in accordance with the present invention and the fabrication method thereof has the following advantages:

1. As shown in FIG. 1B, the traditional plating process is carried out with a plating bar 140 for applying a cathode voltage level to the conductive patterns 120 and 130. However, a seed layer 240 shown in FIG. 2H in accordance with the present invention is able to build a current transmission path for applying the cathode voltage level to the conductive pattern 220. Upon such an arrangement, the plating bar 140 in the prior art is no more needed. Therefore, the area available for laying conductive patterns may be increased to allocate more connecting points on the packaging substrate, and also possible operation noise caused by the plating bar can be avoided.

2. Although the prior art electroless plating process does not need the plating bar, it has a primary drawback of a poor adhesion resulted between the plating layer and the plated. Whereas, as shown in FIG. 2H, the metal pads 224 are formed by using traditional electro-plating technology to guarantee a tightly adhesion with the conductive patterns 220.

3. In the prior fabrication method, the metal pads, formed on the upper surface and the bottom surface of the packaging substrate with identical surface plating process, have similar thickness and material composition. However, different connecting means adapted to different connection method and with different arrayed density are preferred for most packaging designs. Thus, as shown in FIG. 2I, the packaging substrate in accordance with the present invention has metal pads 224 typically using gold/nickel plated layers for connecting to the die pad, and solder layers 236 for connecting to the printed circuit board with or without pins or balls. In addition, the thickness of the metal pads 224 formed by electroplating may be controlled with high precision. Consequently, the packaging substrate in accordance with the present invention is suitable to various packaging, with different connecting means, and also has a potential to reduce the fabrication cost.

With the example and explanations above, the features and spirits of the invention will be hopefully well described. Those skilled in the art will readily observe that numerous modifications and alterations of the device may be made when retaining the teaching of the invention. Accordingly, the above disclosure should be construed as limited only by the metes and bounds of the appended claims.

What is claimed is:

1. A fabrication method of a packaging substrate comprising the steps of:

forming a first conductive pattern on an upper surface of a substrate and forming a second conductive pattern on a bottom surface of the substrate, wherein the second conductive pattern is electrically connected to the first conductive pattern;

forming a first solder mask on the upper surface of the substrate to define first connecting positions on the first conductive pattern and forming a second solder mask on the bottom surface to define second connecting positions on the second conductive pattern;

forming a seed layer on the bottom surface of the substrate, the seed layer is electrically connected to the second conductive pattern;

forming a passivation layer on a surface of the seed layer; and connecting a cathode to the seed layer for plating metal pads covering the exposed first conductive pattern.

2. The fabrication method of claim 1, further comprises under-coating isolation layers in the openings of the first conductive pattern before forming the first solder mask.

3. The fabrication method of claim 1, further comprises under-coating isolation layers in the openings of the second conductive pattern before forming the second solder mask.

4. The fabrication method of claim 1, further comprises filling solder layers in the openings of the second solder mask before forming the seed layer.

5. The fabrication method of claim 4, further comprises forming an organic surface preservation (OSP) layer in the openings of the second solder mask before filling solder layers in the openings of the second solder mask.

6. The fabrication method of claim 1, further comprises filling solder layers in the openings of the second solder mask after forming the seed layer.

7. The fabrication method of claim 6, further comprising forming an OSP layer in the openings of the second solder mask before filling solder layers in the openings of the second solder mask.

8. The fabrication method of claim 1, further comprises removing the passivation layer and the exposed portions of the seed layer after forming metal pads on the exposed first conductive pattern.

9. A fabrication method of packaging substrate comprising the steps of:

forming a first solder mask on an upper surface of a circuit board to define first connecting positions thereon and forming a second solder mask on a bottom surface of the circuit board to define second connecting positions thereon;

forming a seed layer on the second solder mask;

forming a passivation layer on a bottom surface of the seed layer;

connecting a cathode to the seed layer for plating metal pads on an exposed conductive pattern;

removing the passivation layer; and removing the seed layer.

10. The fabrication method of claim 9, further comprises filling solder layers in the openings of the second solder mask before forming the seed layer.

11. The fabrication method of claim 10, further comprises forming an OSP layer in the openings of the second solder mask before filling solder layers in the openings of the second solder mask, and the OSP layer is vaporized in the step of filling the solder layers in the openings of the second solder mask.

12. The fabrication method of claim 9, further comprises forming an OSP layer after removing the passivation layer and the seed layer.

* * * * *